United States Patent
Emoto et al.

(10) Patent No.: US 9,929,033 B2
(45) Date of Patent: Mar. 27, 2018

(54) GAS PURGE APPARATUS, LOAD PORT APPARATUS, INSTALLATION STAND FOR PURGING CONTAINER, AND GAS PURGE METHOD

(71) Applicant: TDK Corporation, Minato-ku, Tokyo (JP)

(72) Inventors: Jun Emoto, Tokyo (JP); Tadamasa Iwamoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/087,220

(22) Filed: Mar. 31, 2016

(65) Prior Publication Data
US 2017/0025296 A1    Jan. 26, 2017

(30) Foreign Application Priority Data
Mar. 31, 2015    (JP) .................................. 2015-071641

(51) Int. Cl.
*B65B 31/00* (2006.01)
*H01L 21/673* (2006.01)
*B08B 9/00* (2006.01)

(52) U.S. Cl.
CPC .......... *H01L 21/67389* (2013.01); *B08B 9/00* (2013.01)

(58) Field of Classification Search
CPC ......... H01L 21/67389; H01L 21/67265; B08B 9/00; B08B 5/00
See application file for complete search history.

(56) References Cited

U.S. PATENT DOCUMENTS

| | | | | |
|---|---|---|---|---|
| 5,980,195 A | * | 11/1999 | Miyashita | H01L 21/6732 414/783 |
| 5,988,233 A | * | 11/1999 | Fosnight | H01L 21/67393 141/63 |
| 6,138,721 A | * | 10/2000 | Bonora | H01L 21/67775 141/231 |
| 6,168,364 B1 | * | 1/2001 | Miyajima | H01L 21/67772 414/217 |
| 6,199,604 B1 | * | 3/2001 | Miyajima | H01L 21/67017 141/348 |
| 6,281,516 B1 | * | 8/2001 | Bacchi | H01L 21/67373 206/408 |
| 6,419,438 B1 | * | 7/2002 | Rosenquist | H01L 21/67775 414/217 |
| 6,501,070 B1 | * | 12/2002 | Bacchi | H01L 21/67373 206/387.12 |

(Continued)

FOREIGN PATENT DOCUMENTS

| JP | 2003-060007 A | 2/2003 |
|---|---|---|
| JP | 2005-129706 A | 5/2005 |

(Continued)

*Primary Examiner* — Paul R Durand
*Assistant Examiner* — Randall Gruby
(74) *Attorney, Agent, or Firm* — Arent Fox LLP

(57) ABSTRACT

In a gas purge apparatus, a load port apparatus, an installation stand for a purging container, and a gas purge method, the inside of the purging container can be filled with a cleaning gas without inclining the purging container. A control means drives a nozzle driving mechanism to move a purge nozzle toward a purge port based on a fixing detection signal detected by a fixing detection sensor showing that the purging container is fixed on a table.

12 Claims, 10 Drawing Sheets

(56) References Cited

U.S. PATENT DOCUMENTS

| | | | | |
|---|---|---|---|---|
| 6,561,894 B1* | 5/2003 | Miyajima | H01L 21/67772 | 454/187 |
| 6,609,876 B2* | 8/2003 | Mages | H01L 21/67769 | 414/411 |
| 6,641,348 B1* | 11/2003 | Schultz | H01L 21/67775 | 414/217 |
| 6,795,202 B2* | 9/2004 | Emoto | H01L 21/67265 | 250/559.33 |
| 6,816,251 B2* | 11/2004 | Swan | G01N 21/9506 | 250/559.36 |
| 6,817,822 B2* | 11/2004 | Tokunaga | H01L 21/67772 | 414/217 |
| 6,896,470 B1* | 5/2005 | Chen | H01L 21/67772 | 414/217 |
| 7,077,173 B2* | 7/2006 | Tokunaga | H01L 21/67017 | 141/66 |
| 7,204,669 B2* | 4/2007 | Cho | H01L 21/67259 | 414/800 |
| 7,665,787 B2* | 2/2010 | Obayashi | H01L 21/67766 | 294/103.1 |
| 8,444,125 B2* | 5/2013 | Natsume | H01L 21/67775 | 141/98 |
| 8,821,098 B2* | 9/2014 | Natsume | H01L 21/67772 | 414/217 |
| 8,888,433 B2* | 11/2014 | Gilchrist | H01L 21/67353 | 414/217.1 |
| 9,010,384 B2* | 4/2015 | Yoshimura | H01L 21/67772 | 141/63 |
| 9,082,807 B2 | 7/2015 | Sugawara | H01L 21/68735 | |
| 9,174,253 B2* | 11/2015 | Natsume | B08B 9/093 | |
| 9,305,817 B2* | 4/2016 | Kaise | H01L 21/67772 | |
| 9,406,537 B2* | 8/2016 | Oyama | H01L 21/67373 | |
| 2002/0044859 A1* | 4/2002 | Lee | H01L 21/67775 | 414/411 |
| 2002/0051701 A1* | 5/2002 | Saeki | H01L 21/67775 | 414/222.01 |
| 2003/0049101 A1 | 3/2003 | Seita | | |
| 2004/0013498 A1* | 1/2004 | Soucy | H01L 21/67775 | 414/217 |
| 2004/0035493 A1* | 2/2004 | Miyajima | H01L 21/67126 | 141/98 |
| 2005/0095098 A1* | 5/2005 | Miyajima | H01L 21/67379 | 414/411 |
| 2006/0288664 A1* | 12/2006 | Okabe | H01L 21/67393 | 53/510 |
| 2007/0080096 A1* | 4/2007 | Miyajima | H01L 21/67126 | 206/710 |
| 2007/0210533 A1* | 9/2007 | Okabe | F16J 15/002 | 277/628 |
| 2007/0231112 A1* | 10/2007 | Miyajima | H01L 21/67379 | 414/222.01 |
| 2008/0112784 A1* | 5/2008 | Rogers | H01L 21/67775 | 414/411 |
| 2008/0260498 A1* | 10/2008 | Nagata | H01L 21/67017 | 414/217 |
| 2009/0175709 A1* | 7/2009 | Okabe | H01L 21/67017 | 414/222.02 |
| 2009/0241302 A1* | 10/2009 | Natsume | H01L 21/67775 | 24/457 |
| 2009/0297298 A1* | 12/2009 | Okabe | H01L 21/67276 | 414/217.1 |
| 2011/0214778 A1 | 9/2011 | Natsume et al. | | |
| 2012/0309286 A1* | 12/2012 | Nakano | H01L 21/67775 | 454/305 |
| 2013/0326841 A1* | 12/2013 | Natsume | B08B 9/093 | 15/405 |
| 2014/0000757 A1* | 1/2014 | Takahara | H01L 21/67769 | 141/8 |
| 2014/0109516 A1* | 4/2014 | Tominaga | H01L 21/67393 | 53/432 |
| 2014/0157722 A1* | 6/2014 | Iwamoto | H01L 21/67775 | 53/111 R |
| 2014/0305540 A1* | 10/2014 | Oyama | H01L 21/67389 | 141/4 |
| 2015/0000785 A1* | 1/2015 | Shin | F17C 5/007 | 141/4 |
| 2015/0235885 A1* | 8/2015 | Iwamoto | H01L 21/67389 | 53/86 |
| 2015/0243538 A1* | 8/2015 | Miyajima | H01L 21/67772 | 206/711 |
| 2016/0276189 A1* | 9/2016 | Igarashi | H01L 21/67393 | |
| 2017/0025296 A1* | 1/2017 | Emoto | H01L 21/67389 | |
| 2017/0025298 A1* | 1/2017 | Iwamoto | B08B 5/00 | |

FOREIGN PATENT DOCUMENTS

| | | |
|---|---|---|
| JP | 2011-187539 A | 9/2011 |
| JP | 2014-036184 A | 2/2014 |

* cited by examiner

GAS PURGE APPARATUS, LOAD PORT APPARATUS, INSTALLATION STAND FOR PURGING CONTAINER, AND GAS PURGE METHOD

CROSS-REFERENCE TO RELATED APPLICATION

This application claims the priority of Japanese Patent Application No. 2015-071641, filed on Mar. 31, 2015.

BACKGROUND OF THE INVENTION

1. Field of the Invention

The present invention relates to a gas purge apparatus, a load port apparatus, an installation stand for purging container, and a gas purge method.

2. Description of the Related Art

For example, manufacturing process of semiconductors includes the following technique (bottom purge): a gas purge nozzle is arranged on an installation stand of a load port apparatus and is made contact with a gas purge port provided at a bottom part of a wafer transport container to introduce a purge gas therethrough and clean the inner atmosphere of the wafer transport container by the purge gas.

Upon performing the bottom purge, the purge nozzle is moved toward the purge port to be in contact with the gas purge port provided at the bottom part of the wafer transport container (e.g., see Patent Document 1). At that time, a plurality of the purge ports provided at the bottom part of the transport container has various port connection heights, which may cause the purge nozzle to push up the container and generate a placement failure.

If the transport container is inclined due to the placement failure, handling performance of wafers is adversely affected. For example, the following problems arise: the wafers placed on a shelf inside of the transport container may be damaged due to their inclination; and an insufficient contact between the purge port and the purge nozzle causes a purge gas leak and an outside gas inflow into the transport container.

Patent Document 1: Japanese Patent Laid-Open No.2003-60007

SUMMARY OF THE INVENTION

The present invention has been achieved in consideration of the circumstances. It is an object of the invention to provide a gas purge apparatus, a load port apparatus, an installation stand for purging container, and a gas purge method capable of filling inside of a purging container with a cleaning gas without inclining the purging container.

To achieve the above object, the gas purge apparatus according to the present invention is capable of blowing a cleaning gas into a purging container with a purge port therethrough, and comprises:

a purge nozzle with a nozzle opening blowing out the cleaning gas;

a table on which the purging container is detachably placed;

a fixing mechanism configured to fix the purging container to prevent it from moving relatively on the table;

a fixing detection sensor configured to detect whether the purging container is fixed on the table;

a nozzle driving mechanism capable of moving the purge nozzle toward the purge port; and a control means configured to drive the nozzle driving mechanism to move the purge nozzle toward the purge port based on a fixing detection signal detected by the fixing detection sensor showing that the purging container is fixed on the table.

A gas purge method according to the present invention is for blowing a cleaning gas into a purging container with a purge port therethrough, and comprises the step of moving a purge nozzle toward the purge port after detecting a fixing of the purging container on a table.

In the gas purge apparatus and the gas purge method according to the present invention, the purge nozzle and the purge port are connected by moving the purge nozzle toward the purge port after the purging container is fixed on the table. This prevents the purge nozzle from pushing up the container, and a placement failure hardly happens to the container.

Also, there is no risk that the container leans, and handling performance of wafers or so housed in the container is hardly adversely affected. Also, the purge port and the purge nozzle are sufficiently in contact with, which hardly causes gas leak and prevents outside gas from flowing into the purging container.

The fixing mechanism of the present invention is not limited and includes an upper holding mechanism holding the purging container toward the table from above, a side holding mechanism engaging with a side lower part of the purging container, or the like.

Preferably, the fixing mechanism is a clamp mechanism detachably engaging with the purging container. Preferably, the clamp mechanism is provided to be relatively movable to the table and detachably engaged with a bottom of the purging container.

When the purging container is placed on the table, the clamp mechanism is not obstacle compared with the upper holding mechanism. Also, the side holding mechanism needs to arrange at least a pair of holding mechanisms and thus has a large-scale apparatus. On the other hand, a bottom clamp mechanism engaging with the bottom can perform fixing by arranging only one holding mechanism, which contributes to downsizing of the apparatus.

Preferably, the gas purge apparatus according to the present invention further comprises a position detecting sensor for detecting whether the purging container is placed at a predetermined position on the table, wherein the control means drives the fixing mechanism to fix the purging container on the table based on a normal position detecting signal detected by the position detecting sensor showing that the purging container is placed at the predetermined position on the table.

An operation for fixing the container on the table is securely performed by detecting the fact that the purging container is at a normal position on the table and then fixing the container on the table. Note that, when the container is not at a normal position on the table, the control means may generate an alarm or so.

Preferably, the gas purge apparatus according to the present invention further comprises a load presence sensor configured to detect whether the purging container is on the table, wherein the control means confirms a detection signal from the position detecting sensor based on a load presence signal detected by the load presence sensor showing that the purging container is on the table.

When the control means determines that the purging container is not on the table based on the detection signal from the load presence sensor, there is no need to check the detection signal from the position detecting sensor, malfunction can be prevented, and energy saving can be achieved.

A load port apparatus according to the present invention comprises any of the gas purge apparatuses mentioned above. Also, an installation stand for the purging container according to the present invention comprises any of the gas purge apparatuses.

DESCRIPTION OF THE PREFERRED EMBODIMENTS

Hereinafter, the present invention will be explained based on embodiments shown in the figures.

Figure 1:
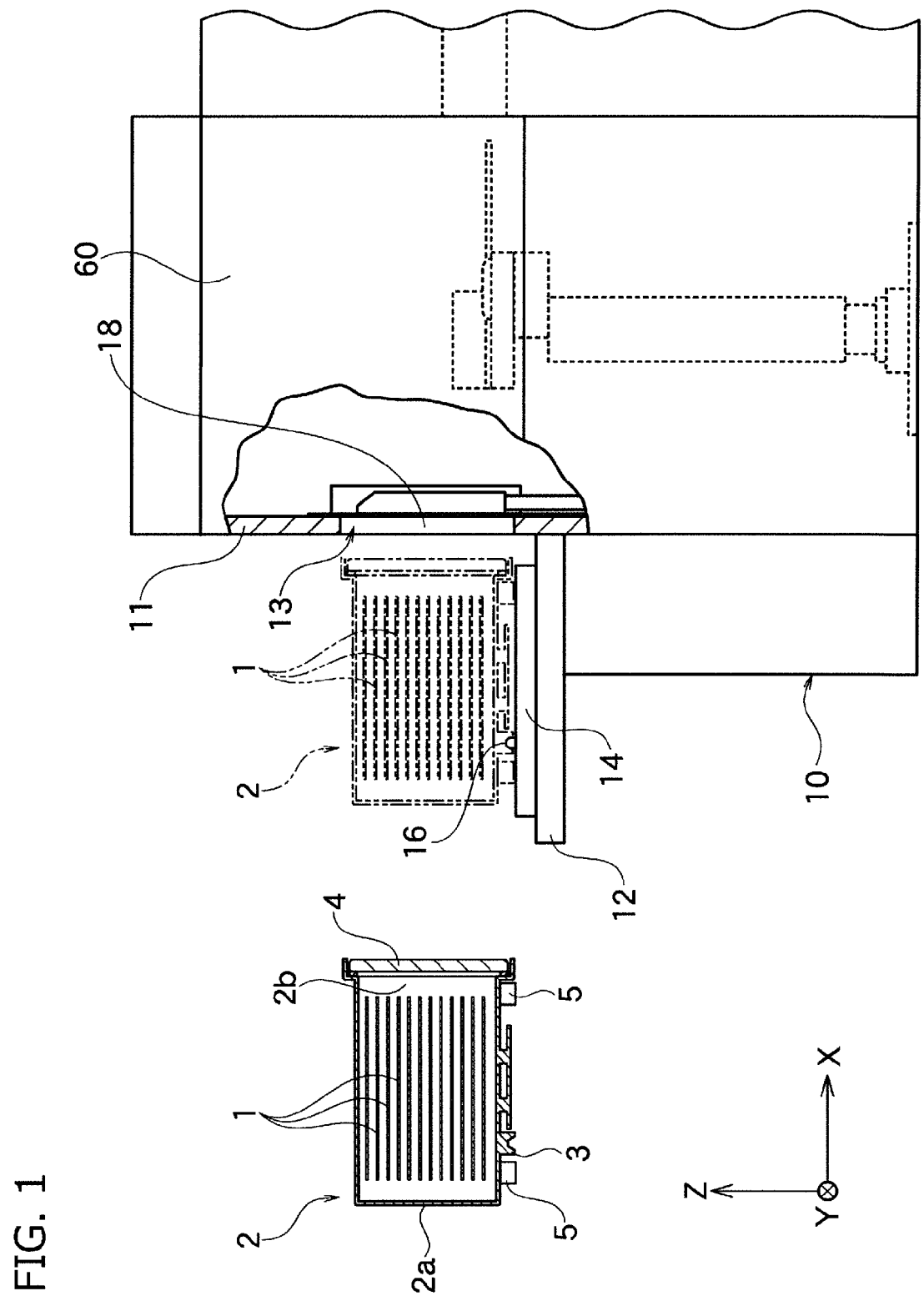
FIG. 1 is a schematic view of a load port apparatus to which a gas purge unit according to one embodiment of the present invention is applied.

As shown in FIG. 1, a load port apparatus 10 according to one embodiment of the present invention is connected to a semiconductor processing apparatus 60. The load port apparatus 10 has an installation stand 12 and a movable table 14. The table 14 is movable in the X-axis direction on the installation stand 12. Note that, in the figures, the X-axis represents a moving direction of the table 14, the Z-axis represents a vertical direction, and the Y-axis represents a direction vertical to the X-axis and the Z-axis.

A sealed transport container 2 can be detachably placed on a top in the Z-axis direction of the table 14. The container 2 is made of a pot, a FOUP, or the like for transporting a plurality of wafers 1 while they are sealed and stored. The container 2 houses a casing 2a. A space for housing the wafers 1 to be processed is formed in the casing 2a. The casing 2a has an approximately box shape where an opening is formed on one of its surfaces in the horizontal direction. Note that, the casing 2a has a bottom that is similar to a plane shape of the table 14 shown in FIG. 2.

Also, the container 2 has a lid 4 for sealing an opening 2b of the casing 2a. Shelves (not shown) for vertically overlapping the wafers 1 held horizontally are arranged in the casing 2a. Each of the wafers 1 placed on the shelves is housed in the container 2 at regular intervals.

The load port apparatus 10 is an interface device for transporting the wafers 1 housed in a sealed state in the container 2 into the semiconductor processing apparatus 60 while maintaining a clean condition. The load port apparatus 10 has a door 18 opening and closing a delivery port 13 of a wall member 11. The wall member 11 is configured to function as part of a casing for sealing inside of the semiconductor processing apparatus 60 in a clean condition, or as part of a casing for sealing inside of an apparatus such as an EFEM connecting the semiconductor processing apparatus 60 and the load port apparatus 10 in a clean condition. The movement of the door 18 will be briefly explained with reference to FIG. 5A to FIG. 5D.

Figure 5A:
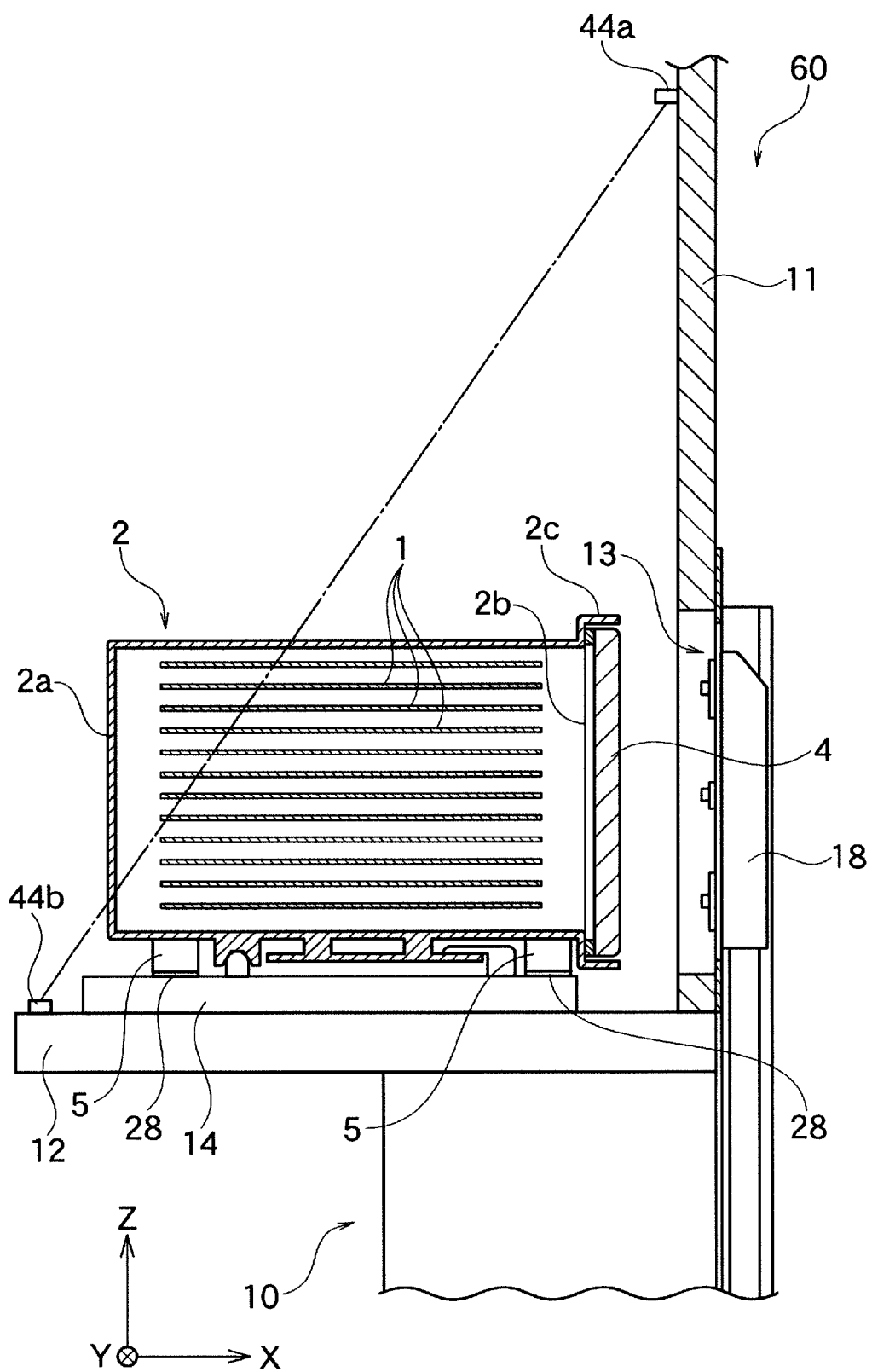
FIG. 5A is a schematic cross section showing an example of load presence sensors.
Figure 5B:
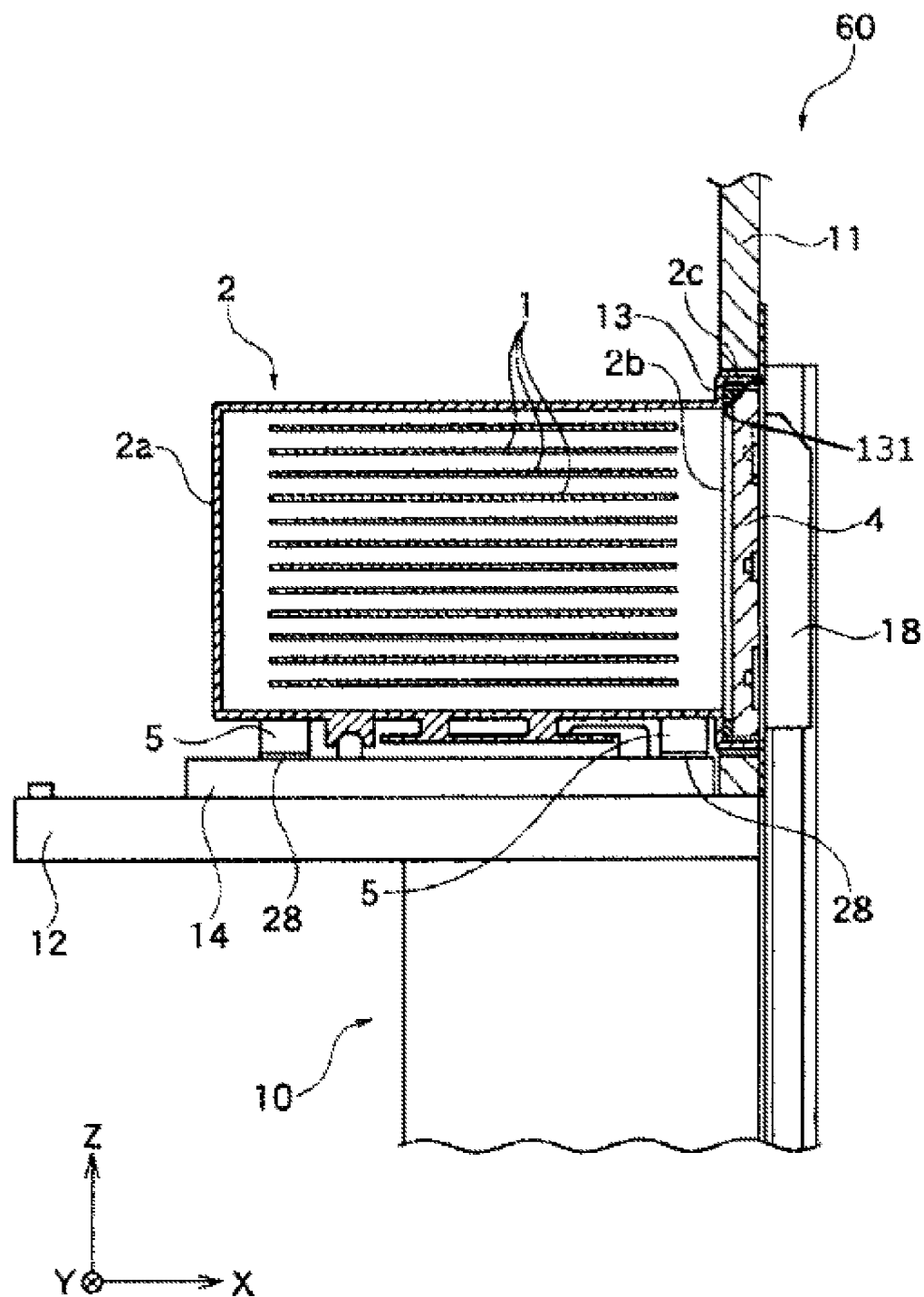
FIG. 5B is a schematic view showing a step where a door of a FOUP is opened by a load port apparatus.

As shown in FIG. 5A, when the container 2 is installed on the table 14, a bottom gas purge by purge ports 5 and purge nozzles 28 is performed based on control mentioned below. Then, as shown in FIG. 5B, under a condition that the bottom gas purge is being performed, the table 14 is moved in the X-axis direction, and an opening edge 2c with the lid 4 airtightly sealing the opening 2b of the container 2 enters the delivery port 13 of the wall member 11.

Figure 5C:
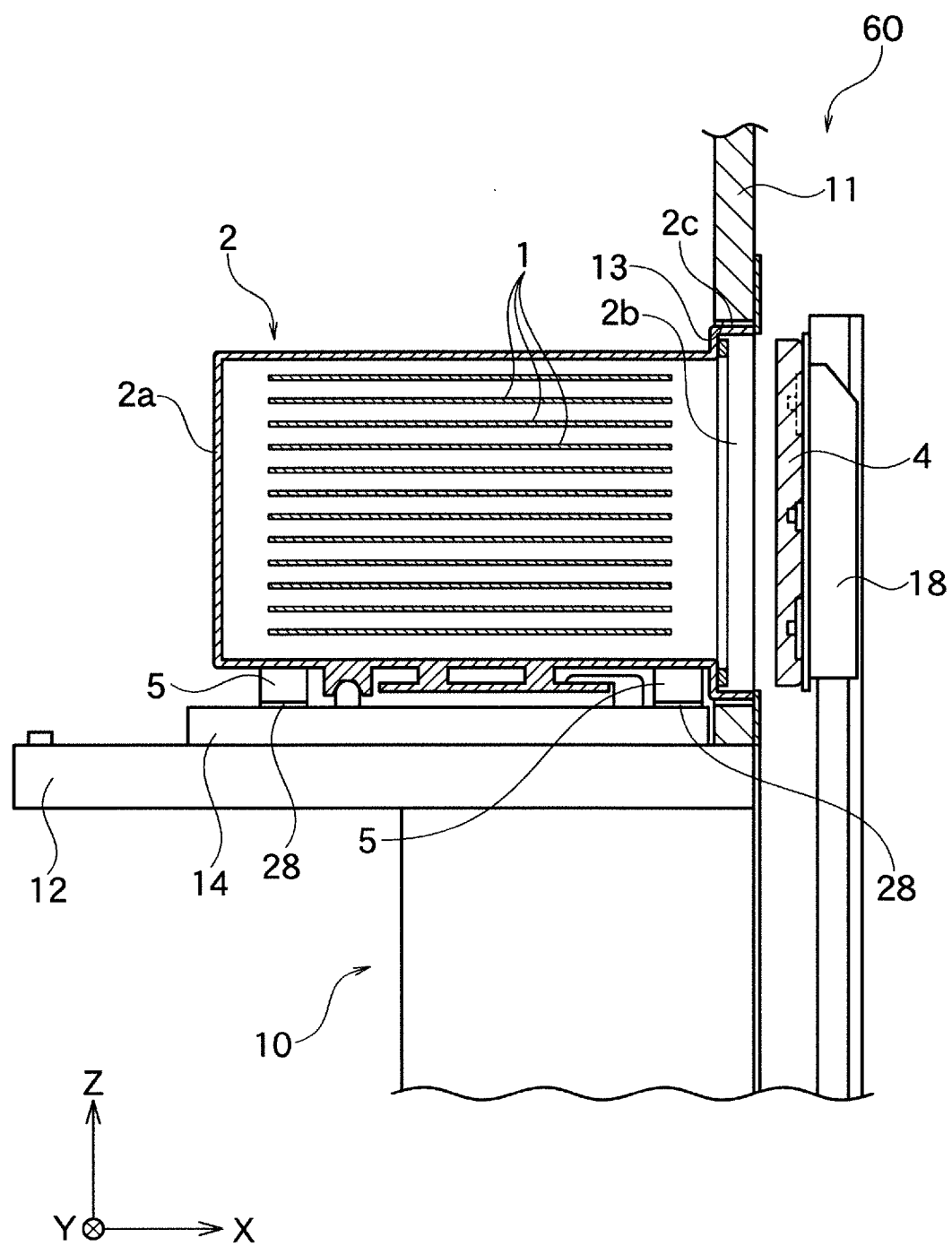
FIG. 5C is a schematic view showing the following step of FIG. 5B.

At the same time, the door 18 located inside of the wall 11 (opposite side to the table 14) is engaged with the lid 4 of the container 2. At that time, a space between the opening edge 2c and an opening edge of the delivery port 13 is sealed by gasket 131 or so, and the space is sealed in a good condition. Thereafter, as shown in FIG. 5C, the container 2 and the wall 11 are internally connected by moving the door 18 together with the lid 4 in parallel along the X-axis direction or moving them rotationally, detaching the lid 4 from the opening edge 2c, and opening the opening 2b. At that time, the bottom gas purge may be continuously operated, or in addition to the bottom purge, a purge gas (cleaning gas), including nitrogen gas or other inert gas, may blow out from the inside of the wall 11 into the container 2 (front purge).

Figure 5D:
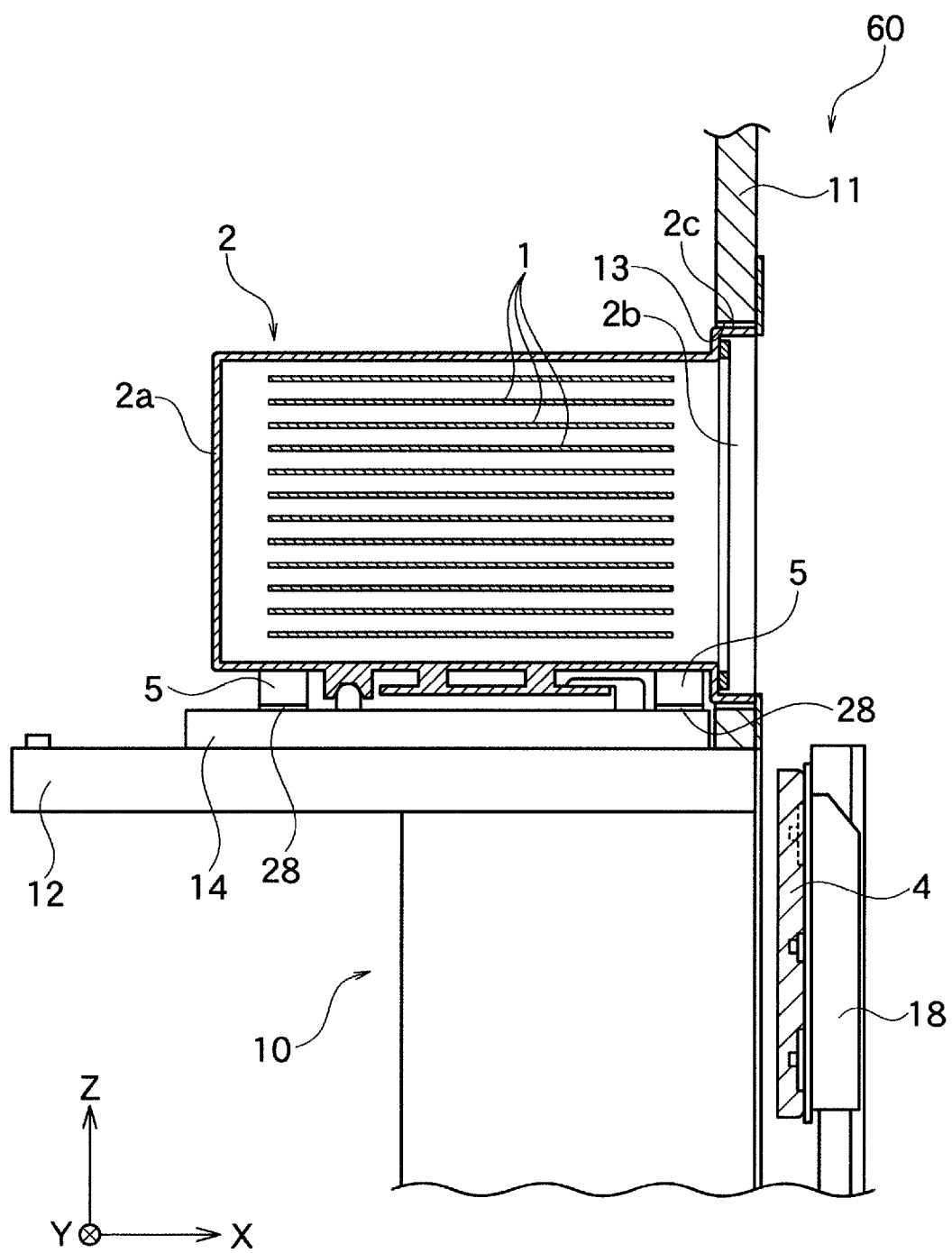
FIG. 5D is a schematic view showing the following step of FIG. 5C.

Next, as shown in FIG. 5D, when the door 18 is moved downward in the Z-axis in the wall 11, the opening 2b of the container 2 is completely opened to the inside of the wall 11, and the wafers 1 are delivered into the wall 11 through the opening 2b by such as a robot hand arranged inside of the wall 11. At that time, the container 2 and the wall 11 are internally cut off from the outside air, and the bottom purge and/or the front purge may be continuously operated to maintain a clean environment within the container 2. An operation opposite to the above may be carried out to return the wafers 1 to the inside of the container 2 and detach it from the table 14.

Figure 2:
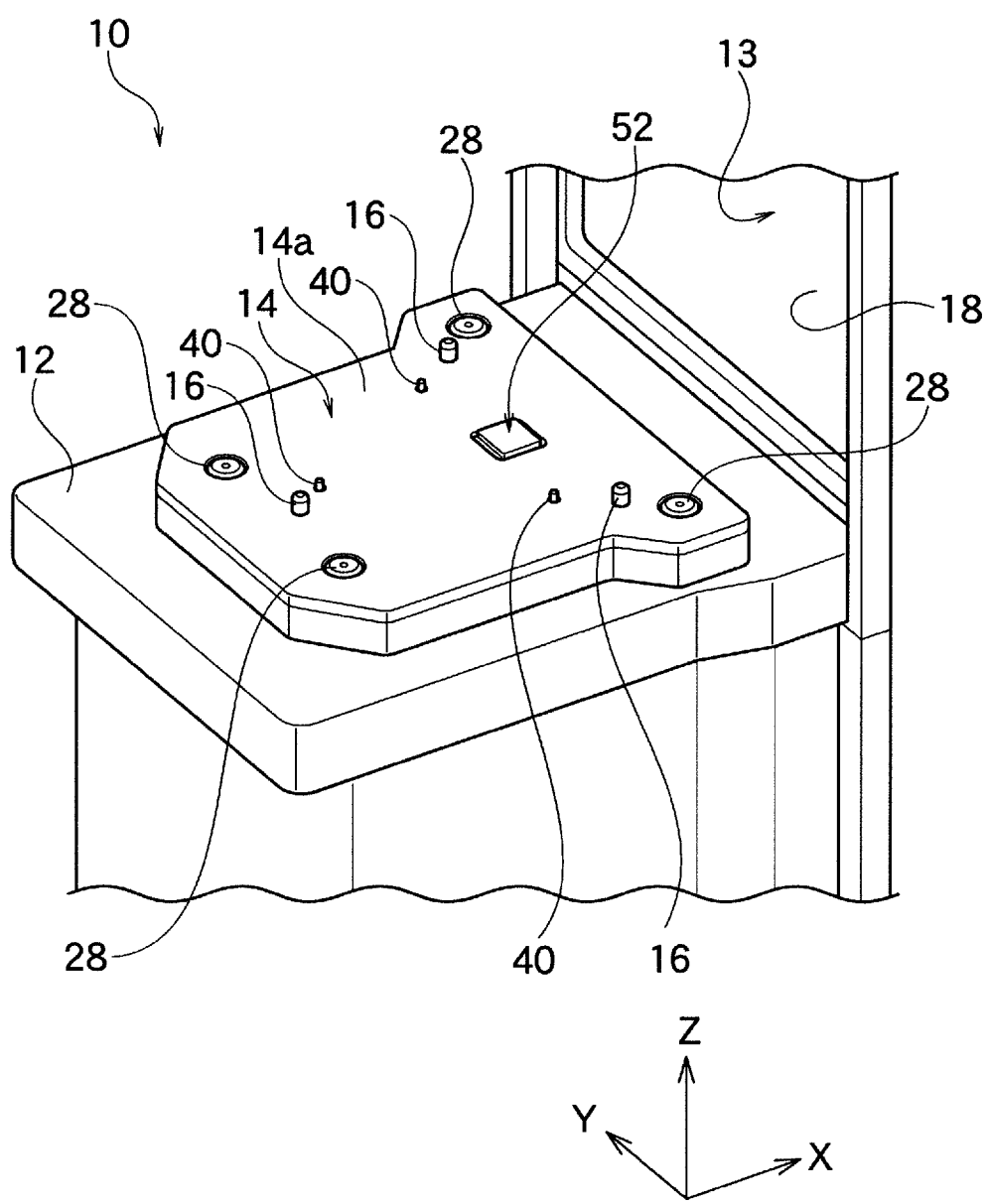
FIG. 2 is a perspective view of a main part showing a vicinity of a table of the load port apparatus shown in FIG. 1.

As shown in FIG. 2, one or more (preferably three) positioning pins 16 are embedded on a top surface 14a of the table 14 and engaged with concave parts of the positioning portion 3 arranged on the bottom of the casing 2a. This uniquely determines a positional relation of the X-axis and the Y-axis between the container 2 and the table 14.

Also, position detecting sensors 40 are arranged near the respective positioning pins 16 on the top surface 14a of the table 14. The position detecting sensors 40 detect whether the container 2 is positioned at a predetermined position in the X-Y axis direction of the top surface 14a of the table 14. Any sensor can be used as the position detecting sensor 40, and a contact type position detecting sensor or a non-contact type position detecting sensor may be used.

The contact type position detecting sensor includes an electric detecting sensor whose switch is turned on by being in contact with part of the bottom of the container 2. Also, the non-contact type position detecting sensor includes a light detecting sensor and a magnetic force detecting sensor.

Figure 3A:
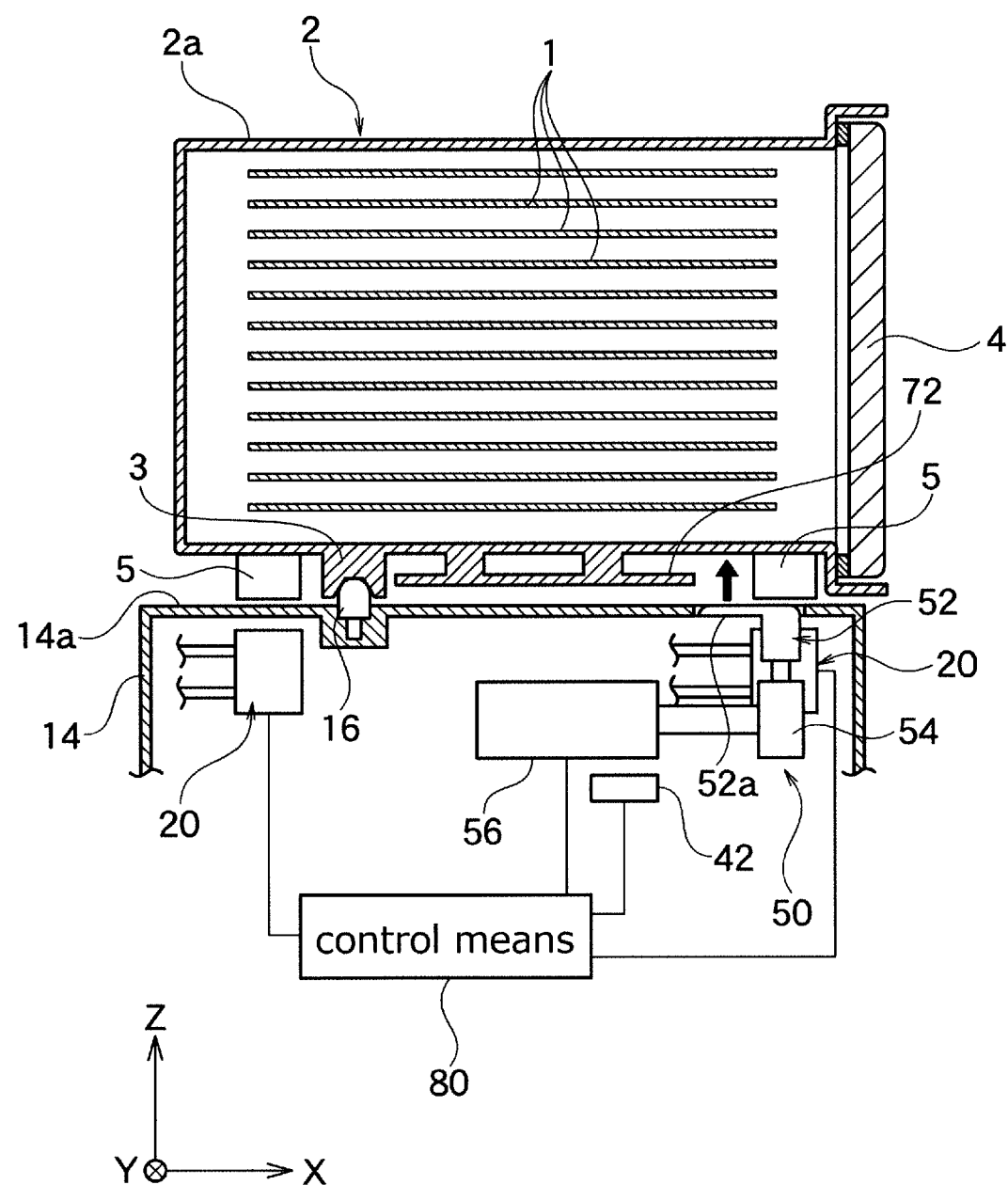
FIG. 3A is a schematic cross section of a gas purge apparatus assembled in the load port apparatus shown in FIG. 1 and FIG. 2.

In either case, detection signals detected by the position detecting sensors 40 are inputted to a control means 80 shown in FIG. 3A. The control means 80 consists of a control circuit, such as IC chip.

As shown in FIG. 2, heads of the purge nozzles 28 are further exposed on the top surface 14a of the table 14. In this embodiment, the purge nozzles 28 are arranged at four places. Two purge nozzles 28 arranged near the door 18 are for discharge, and the other two purge nozzles 28 are for supply. The number of the purge nozzles 28 and their arrangement are not limited. Each of the purge nozzles 28 is attached to gas purge units 20 with a nozzle driving mechanism shown in FIG. 3A and FIG. 4A.

Figure 4A:
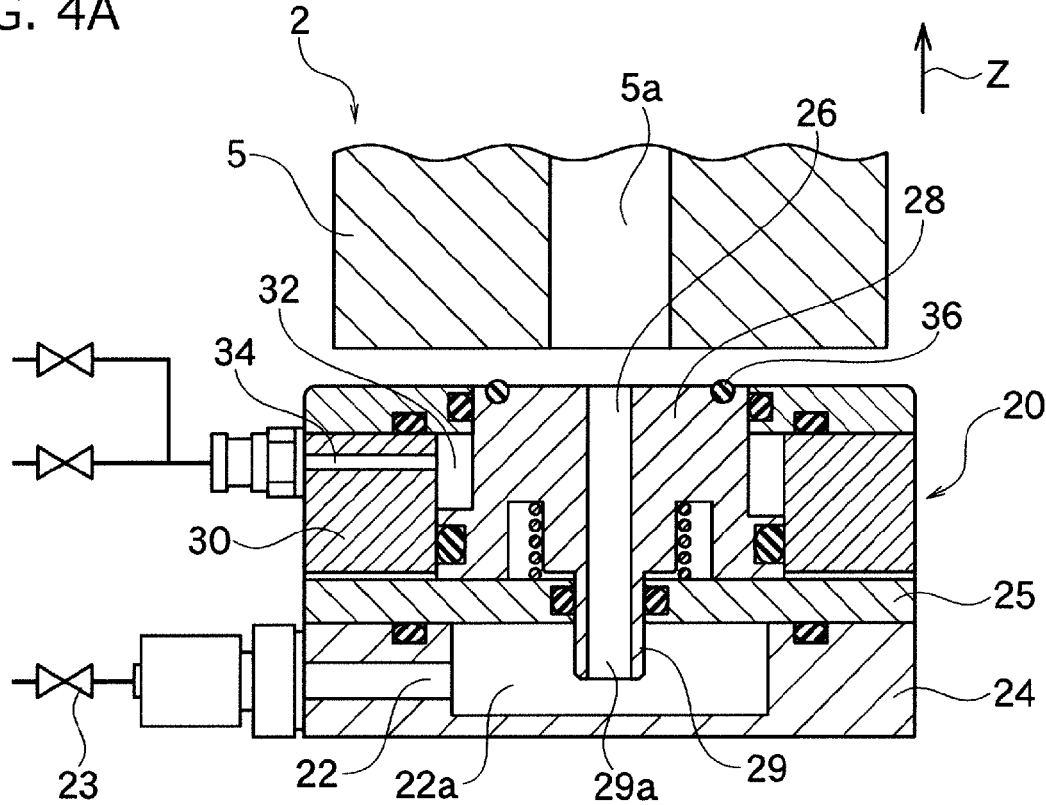
FIG. 4A is a schematic cross section showing a nozzle driving mechanism for moving the purge nozzle shown in FIG. 3A to FIG. 3C.
Figure 4B:
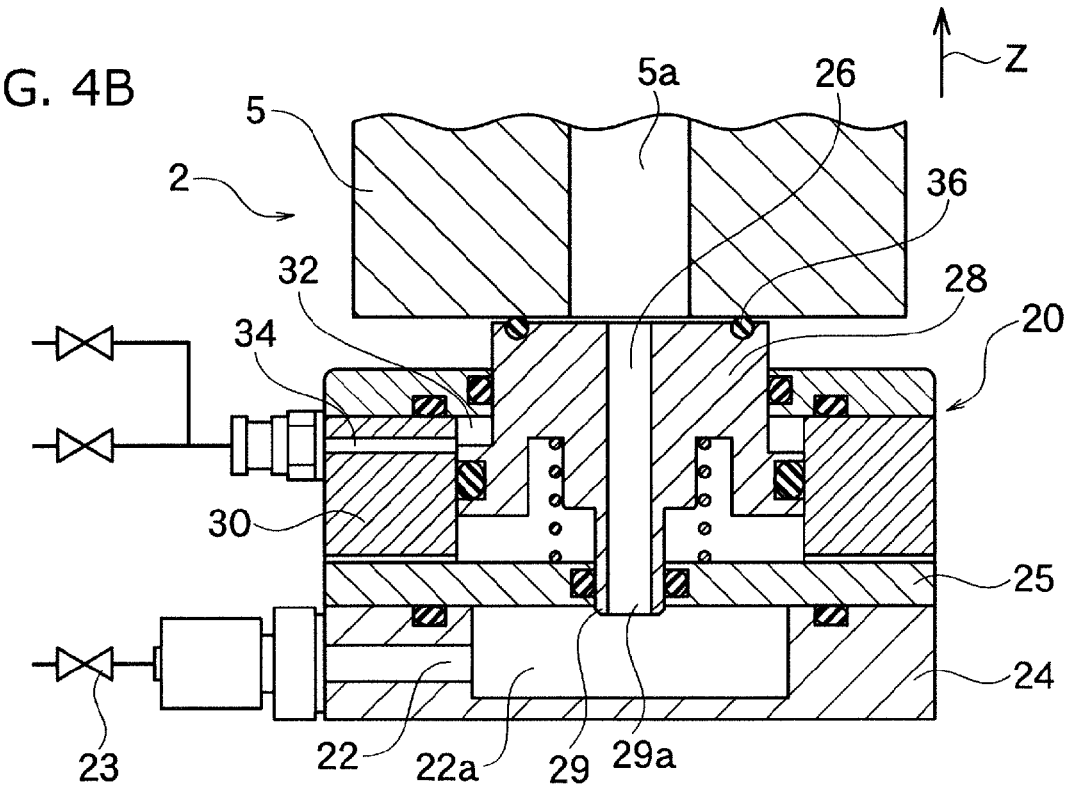
FIG. 4B is a schematic cross section showing a movement of a purge nozzle.

The gas purge units 20 include one for supply and one for discharge, but both of these just have a purging gas flow opposite to each other and have the same structure, such as one shown in FIG. 4A and FIG. 4B. Hereinafter, the gas purge unit 20 for supply will be explained based on FIG. 4A and FIG. 4B, but the gas purge unit for discharge will not be explained, since it is just different from the gas purge unit 20 for supply in terms of discharge/supply and has the same structure thereas.

As shown in FIG. 4A and FIG. 4B, the gas purge unit 20 has a supply member 24 with a supply passage 22 for supplying a cleaning gas, such as nitrogen gas and other inert gas. A cylinder 30 is fixed above in the Z-axis direction of the supply member 24 through a partition plate 25. The piston-type purge nozzle 28 is housed in the cylinder 30 to be capable of relatively moving in the Z-axis direction.

A piston chamber 32 is formed between the piston-type purge nozzle 28 and the cylinder 30. A pressure fluid, such as oil, is introduced to the piston chamber 32 or discharged therefrom through a passage 34, and thus the purge nozzle 28 can be moved up and down in the Z-axis direction relatively to the cylinder 30.

FIG. 4A shows a state where the purge nozzle 28 is moved to the lowermost position in the Z-axis direction, and FIG. 4B shows a state where the purge nozzle 28 is moved to the uppermost position in the Z-axis direction. In the state of FIG. 4A, the head (top portion) in the Z-axis direction of the purge nozzle 28 is flush with the top surface 14a of the table 14 or dented as shown in FIG. 2.

In the state of FIG. 4B, the head of the purge nozzle 28 is popped upward in the Z-axis direction from the top surface 14a of the table 14 shown in FIG. 2, and is closely in contact with the bottom surface of the purge port 5 formed on the bottom of the container 2 shown in FIG. 4B. The head of the purge nozzle 28 is equipped with a seal member 36, such as O-ring, and thus a nozzle opening 26 of the purge nozzle 28 and a purge opening 5a of the purge port 5 are connected airtightly.

A communication nozzle 29 is formed at the end in the Z-axis direction of the purge nozzle 28. A communication opening 29a of the communication nozzle 29 is configured to be in connect with a space 22a of the supply passage 22 regardless of the movement in the Z-axis direction of the purge nozzle 28. The supply passage 22 is equipped with a control valve 23, for example, which makes it possible to flow a cleaning gas into the supply passage 22.

In the state of FIG. 4B, the purge opening 5a of the purge port 5 is connected to the nozzle opening 26 of the nozzle 28, and the communication opening 29a connecting to the nozzle opening 26 is connected to the space 22a of the supply passage 22. As a result, a bottom purge is performed in such a manner that the cleaning gas is introduced into the container 2 shown in FIG. 5A through the purge openings 5a of the purge ports 5, and that the cleaning gas is discharged from the other purge ports 5. An operation opposite to the above may be performed to stop the bottom purge. The purge units 20 shown in FIG. 4A and FIG. 4B are controlled by the control means 80 shown in FIG. 3A.

As shown in FIG. 2, a head of a hook 52 is exposed in the central area along the Y-axis of the table 14 on the top surface 14a of the table 14. In the state of FIG. 2, the head of the hook 52 is substantially flush with the top surface 14a of the table 14. In this embodiment, the hook 52 is arranged near the door 18 on the top surface 14a of the table 14 (front retaining mechanism), but may be arranged in the substantially central area in the X-axis direction of the table 14 (center retaining mechanism).

As shown in FIG. 3A, the hook 52 is part of the clamp mechanism 50. The clamp mechanism 50 according to the present embodiment has a Z-axis direction driving mechanism 54 and a X-axis direction driving mechanism 56. The Z-axis direction driving mechanism 54 moves the hook 52 up and down in the Z-axis direction. The X-axis direction driving mechanism 56 moves the hook 52 forward and backward in the X-axis direction. The clamp mechanism 50 is controlled by the control means 80.

Figure 3B:
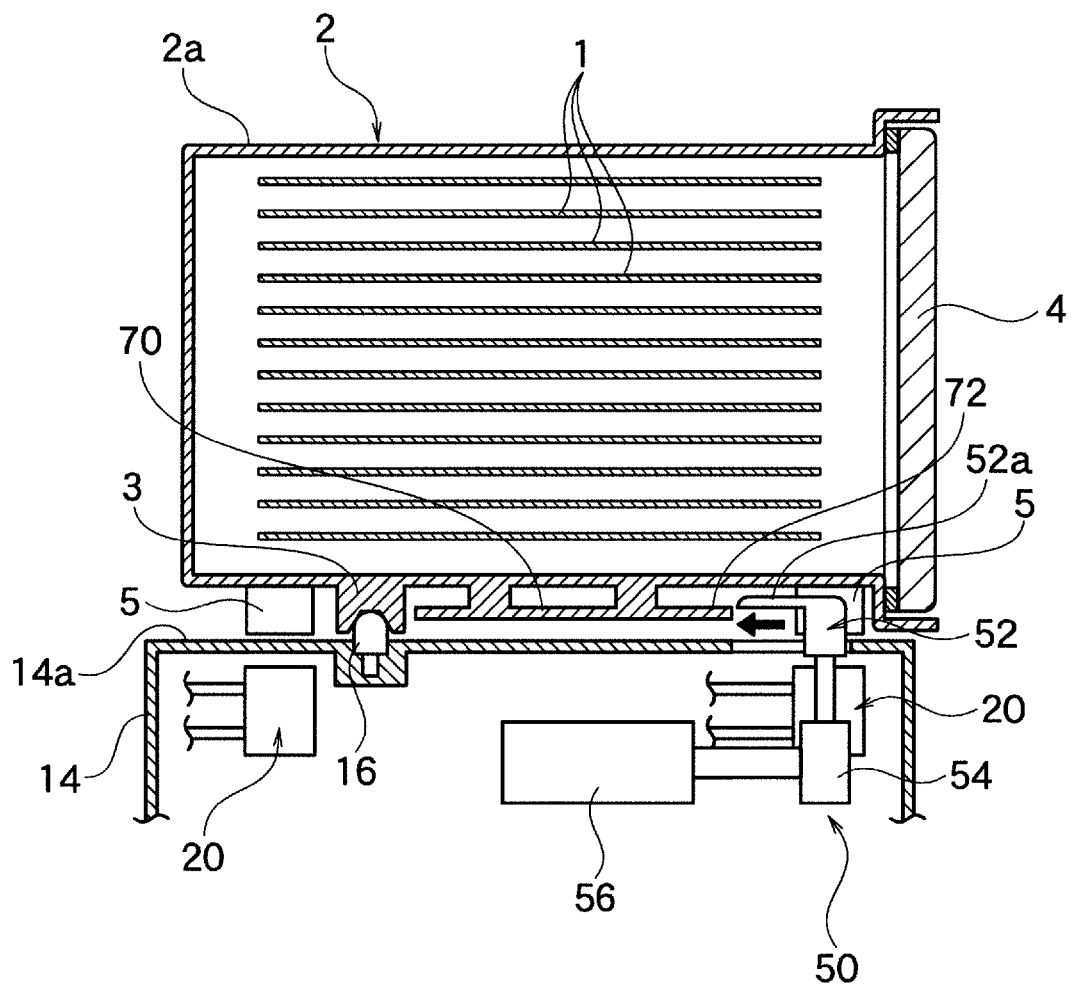
FIG. 3B is a schematic cross section showing a movement of a clamp mechanism of the gas purge apparatus shown in FIG. 3A.

For example, in the state of FIG. 3A, the hook 52 is drawn into the table 14 by the clamp mechanism 50 controlled by the control means 80, and the head of the hook 52 is flush with the top surface 14a of the table 14. When the control means 80 transmits a control signal, the Z-axis driving mechanism 54 is driven, and the hook 52 pops upward from the top surface 14a of the table 14, as shown in FIG. 3B.

Figure 3C:
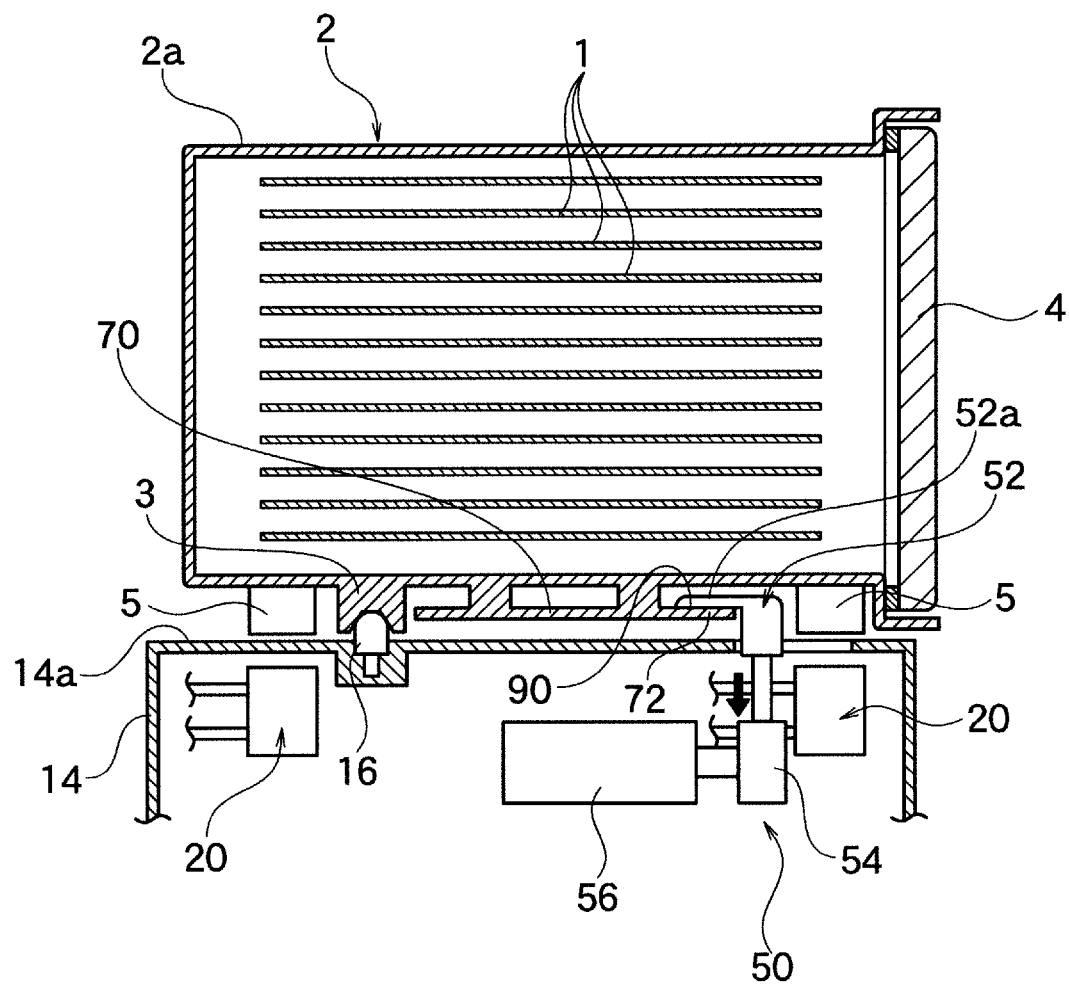
FIG. 3C is a schematic cross section showing the following movement of the clamp mechanism in FIG. 3B.

For example, the bottom of the container 2 is equipped with a bottom plate 70. In the vicinity of the lid 4, an engagement end edge 72 is formed on the bottom plate 70. As shown in FIG. 3C, after the hook 52 is popped upward in the Z-axis direction from the top surface 14a of the table 14, the control means 80 drives the X-axis direction driving mechanism 56, and an engagement convex part 52a of the hook 52 is positioned on a top of the engagement end edge 72.

Thereafter, the control means 80 drives the Z-axis direction driving mechanism 54 to move the hook 52 downward in the Z-axis direction, strongly engage the engagement convex part 52a of the hook 52 with the top of the engagement end edge 72, and fix the container 2 on the top surface 14a of the table 14. The container 2 is restricted to move in the X-axis direction, the Y-axis direction, and the Z-axis direction with respect to the table 14.

In the present embodiment, as shown in FIG. 3A, the clamp mechanism 50 is equipped with a fixing detection sensor 42. The fixing detection sensor 42 detects whether the container 2 is actually fixed on the table 14, and this detection signal is inputted to the control means 80. Any sensor can be used for the fixing detection sensor 42, and a contact type sensor or a non-contact type sensor may be used.

As shown in FIG. 3A, for example, the fixing detection sensor 42 can detect whether the container 2 is restricted to move in the X-axis direction, the Y-axis direction, and the Z-axis direction with respect to the table 14.

Note that, in the figures, the purge ports 5, the positioning pins 16, the hook 52, and the like are illustrated in an enlarged manner compared with the container 2 for easy understanding, but are different from actual dimension ratio.

In the present embodiment, as shown in FIG. 5A, the load port apparatus 10 may be equipped with load presence sensors 44a and 44b. For example, the load presence sensors 44a and 44b consist of light sensors (light emitting element and light receiving element) and may be able to detect whether the container 2 exists on the table 14. Note that, the load presence sensors 44a and 44b are not necessarily non-contact type sensors, such as light sensor, and may be contact type sensors, such as limit switch. Detection signals of the load presence sensors 44a and 44b can be inputted to the control means 80 shown in FIG. 3A.

During storage and transportation of the wafers 1, the inside of the container 2 is sealed, and a clean environment is maintained in the vicinity of the wafers 1. When the container 2 is transported onto the top surface 14a of the table 14, the control means 80 shown in FIG. 3A firstly detects whether the container 2 is on the table 14 based on the detection signals from the load presence sensors 44a and 44b shown in FIG. 5A. Without the detection, the following control step will not be carried out.

When the control means 80 detects the fact that the container 2 exists on the table 14 based on the detection signals from the load presence sensors 44a and 44b, the control means 80 then determines whether the container 2 is placed at a predetermined position on the table 14 by the position detecting sensors 40 shown in FIG. 2. When determining that the container 2 is placed at a predetermined position on the table 14 based on the detection signals from the position detecting sensors 40, the control means 80 controls the clamp mechanism 50 as a fixing mechanism to perform the operations shown in FIG. 3A to FIG. 3C as mentioned above and fix the container 2 on the table 14.

Next, the control means 80 shown in FIG. 3A receives the detection signal from the fixing detection sensor 42 and determines whether the container 2 is securely fixed on the table 14. When determining that the container 2 is securely fixed, the control means 80 then drives and controls the gas purge unit 20 with the nozzle driving mechanism to move the purge nozzles 28 as shown in FIG. 4A and FIG. 4B as mentioned above. That is, the purge nozzles 28 are moved toward the purge ports 5 to be in contact therewith, and the above-mentioned bottom purge is performed. This prevents the purge nozzles 28 from pushing up the container 2, and a placement failure hardly happens to the container 2.

Also, there is no risk that the container 2 leans, and handling performance of the wafers 1 or so housed in the container 2 is hardly adversely affected. Also, the purge ports 5 and the purge nozzles 28 are sufficiently in contact with, which hardly causes gas leak and prevents outside gas from flowing into the container 2 during the bottom purge.

Further, when the container 2 is placed on the table, the clamp mechanism 50 according to the present embodiment is not obstacle, compared with an upper holding mechanism that holds the container 2 from above. Also, a side holding mechanism needs to arrange at least a pair of holding mechanisms and thus has a large-scale apparatus. On the other hand, the clamp mechanism 50 according to the present embodiment can perform fixing by arranging only one holding mechanism, which contributes to downsizing of the apparatus.

Further, in the present embodiment, an operation for fixing the container 2 on the table 14 is securely performed by detecting the fact that the container 2 is at a normal position on the table 14 using the position detecting sensors 40 shown in FIG. 2 and then fixing the container 2 on the table 14. Note that, when the container 2 is not at a normal position on the table 14, the control means 80 may generate an alarm or so.

Further, in the present embodiment, when the control means 80 determines that the container 2 is not on the table 14 based on the detection signals from the load presence sensors 44a and 44b shown in FIG. 5A, there is no need to check the detection signals from the position detecting sensors 40, malfunction can be prevented, and energy saving can be achieved.

Note that, the present invention is not limited to the above-mentioned embodiment, and can be variously changed within the scope thereof The gas purge apparatus of the present invention is applied to the load port apparatus 10 in the above-mentioned embodiments, but may be applied to other apparatus. For example, the gas purge apparatus of the present invention may be applied to a shelf, an installation stand or so for placing and storing a plurality of the containers 2. Alternatively, the gas purge apparatus of the present invention may be arranged in other apparatus or location.

The invention claimed is:

1. A gas purge apparatus capable of blowing a cleaning gas into a purging container with a purge port therethrough, comprising:
    a purge nozzle with a nozzle opening blowing out the cleaning gas;
    a table on which the purging container is detachably placed;
    a fixing mechanism configured to fix the purging container to prevent it from moving in a vertical direction relatively on the table;
    a fixing detection sensor configured to detect whether the purging container is fixed to prevent moving in the vertical direction on the table;
    a nozzle driving mechanism capable of moving the purge nozzle toward the purge port in the vertical direction; and
    a control means configured to drive the nozzle driving mechanism to move the purge nozzle toward the purge port based on a fixing detection signal detected by the fixing detection sensor showing that the purging container is fixed on the table.

2. The gas purge apparatus as set forth in claim 1, wherein the fixing mechanism is a clamp mechanism configured to detachably engage with the purging container.

3. The gas purge apparatus as set forth in claim 2, wherein the clamp mechanism is provided to be relatively movable on the table and is detachably engaged with a bottom surface of the purging container.

4. The gas purge apparatus as set forth in claim 3, further comprising a position detecting sensor for detecting whether the purging container is placed at a predetermined position on the table, wherein
    the control means drives the fixing mechanism to fix the purging container on the table based on a normal position detecting signal detected by the position detecting sensor showing that the purging container is placed at the predetermined position on the table.

5. The gas purge apparatus as set forth in claim 4, further comprising a load presence sensor configured to detect whether the purging container is on the table, wherein
    the control means confirms a detection signal from the position detecting sensor after the position detection sensor detects that the container is in the predetermined position and detecting a load presence signal detected by the load presence sensor showing that the purging container is on the table.

6. The gas purge apparatus as set forth in claim 2, further comprising a position detecting sensor for detecting whether the purging container is placed at a predetermined position on the table, wherein
    the control means drives the fixing mechanism to fix the purging container on the table based on a normal position detecting signal detected by the position detecting sensor showing that the purging container is placed at the predetermined position on the table.

7. The gas purge apparatus as set forth in claim 6, further comprising a load presence sensor configured to detect whether the purging container is on the table, wherein
the control means confirms a detection signal from the position detecting sensor after the position detection sensor detects that the container is in the predetermined position and detecting a load presence signal detected by the load presence sensor showing that the purging container is on the table.

8. The gas purge apparatus as set forth in claim 1, further comprising a position detecting sensor for detecting whether the purging container is placed at a predetermined position on the table, wherein
the control means drives the fixing mechanism to fix the purging container on the table based on a normal position detecting signal detected by the position detecting sensor showing that the purging container is placed at the predetermined position on the table.

9. The gas purge apparatus as set forth in claim 8, further comprising a load presence sensor configured to detect whether the purging container is on the table, wherein
the control means confirms a detection signal from the position detecting sensor after the position detection sensor detects that the container is in the predetermined position and detecting a load presence signal detected by the load presence sensor showing that the purging container is on the table.

10. A load port apparatus, comprising the gas purge apparatus as set forth in claim 1 and a door configured to engage with a lid of the purging container.

11. An installation stand for a purging container, comprising a plurality of gas purge apparatuses as set forth in claim 1.

12. A gas purge method for blowing a cleaning gas into a purging container with a purge port therethrough, comprising the step of moving a purge nozzle toward the purge port in a vertical direction after detecting a fixing of the purging container to prevent its movement in the vertical direction relatively on a table.

* * * * *